United States Patent

Teagno

[15] 3,648,115

[45] Mar. 7, 1972

[54] FUSE UNIT HAVING SLIDABLE FUSE-RECEIVING DRAWER

[72] Inventor: Wladimiro Teagno, Turin, Italy

[73] Assignee: AMP Incorporated, Harrisburg, Pa.

[22] Filed: Sept. 4, 1970

[21] Appl. No.: 69,697

[30] Foreign Application Priority Data

Oct. 17, 1969 Italy .................................23520 A/69

[52] U.S. Cl. ...........................................317/101 DH, 317/114

[51] Int. Cl. ...........................................H05k 5/02, H05k 5/04

[58] Field of Search ...................317/101, 101 DH, 114, 116, 317/15; 337/297

[56] References Cited

UNITED STATES PATENTS

| | | | |
|---|---|---|---|
| 2,934,627 | 4/1960 | Bristol et al. | 337/297 X |
| 3,184,650 | 5/1965 | Ecker | 317/101 DH |
| 3,476,982 | 11/1969 | Bell et al. | 317/101 DH |
| 3,535,594 | 10/1970 | Meyer | 317/101 DH |
| 3,361,884 | 1/1968 | Parkes | 337/297 |
| 3,566,193 | 2/1971 | Jorgensen et al. | 317/101 DH |

*Primary Examiner*—Gerald Goldberg
*Attorney*—William J. Keating, Ronald D. Grefe, Gerald K. Kita, Frederick W. Raring, Jay L. Seitchik and John P. Vandenburg

[57] ABSTRACT

A wiring junction block comprising a stack of printed circuit boards mounted in generally parallel spaced relationship in a frame, edge portions of the boards being exposed at an aperture in the frame for receiving a connector having a plurality of individual edge contacts for engaging respective conductive strips of the different circuit boards at the exposed edges. Conductors are arranged transversely of the circuit boards interconnecting selected conductive strips of different boards.

6 Claims, 5 Drawing Figures

FUSE UNIT HAVING SLIDABLE FUSE-RECEIVING DRAWER

This invention relates to fuse units for electrical circuits and is particularly useful with fuse units for automobile wiring systems and of the kind disclosed in U.S. Pat. application Ser. No. 828,919.

In this patent was disclosed a wiring junction block comprising a stack of printed circuit boards mounted in generally parallel spaced relationship in a frame, edge portions of the boards being exposed at an aperture in the frame for receiving a connector having a plurality of individual edge contacts for engaging respective conductive strips of the different circuit boards at the exposed edges, and conductors arranged transversely of the circuit boards interconnecting selected conductive strips of different boards. In a preferred embodiment the transversely extending conductors are interconnected in pairs of groups through fuse elements.

According to the present invention, a fuse unit comprises a drawer slidably mounted in a support frame, the drawer unit being arranged releasably to receive a printed circuit fuse having a plurality of spaced contacts at an edge disposed at the front of the drawer, a plurality of spaced contacts in the frame being arranged for connection to respective circuit paths and to engage respective contacts at the edge of the fuse, the drawer being slidable in the frame to move the contacts of the fuse into and out of engagement with respective contacts of the frame.

A fuse for a fuse unit according to the invention suitably comprises a rectangular board having similar circuit paths on opposite sides, and on each side the circuit path presenting at forward and rear edges, pluralities of spaced contacts, the contacts of each plurality being interconnected through a respective fusible circuit path, the contacts at the forward and rear edges and the circuit paths on opposite sides being so arranged that any of the four pluralities of spaced contacts can be separately engaged with the plurality of contacts in the frame of the fuse unit.

Preferably the drawer and the fuse have complementary locating means arranged so that the printed circuit fuse can be located in the drawer with either end at the front of the drawer, and either side uppermost in the drawer, the locating means being so arranged that in each condition of location a forward or rear edge of the board is so positioned at the front of the drawer that on sliding the drawer in the frame towards the frame contacts, the frame contacts are engaged with the fuse contacts on the upper side of the fuse.

These and other objects, features and advantages of the present invention will be understood in greater detail from the following description and accompanying drawings.

Figure 1:
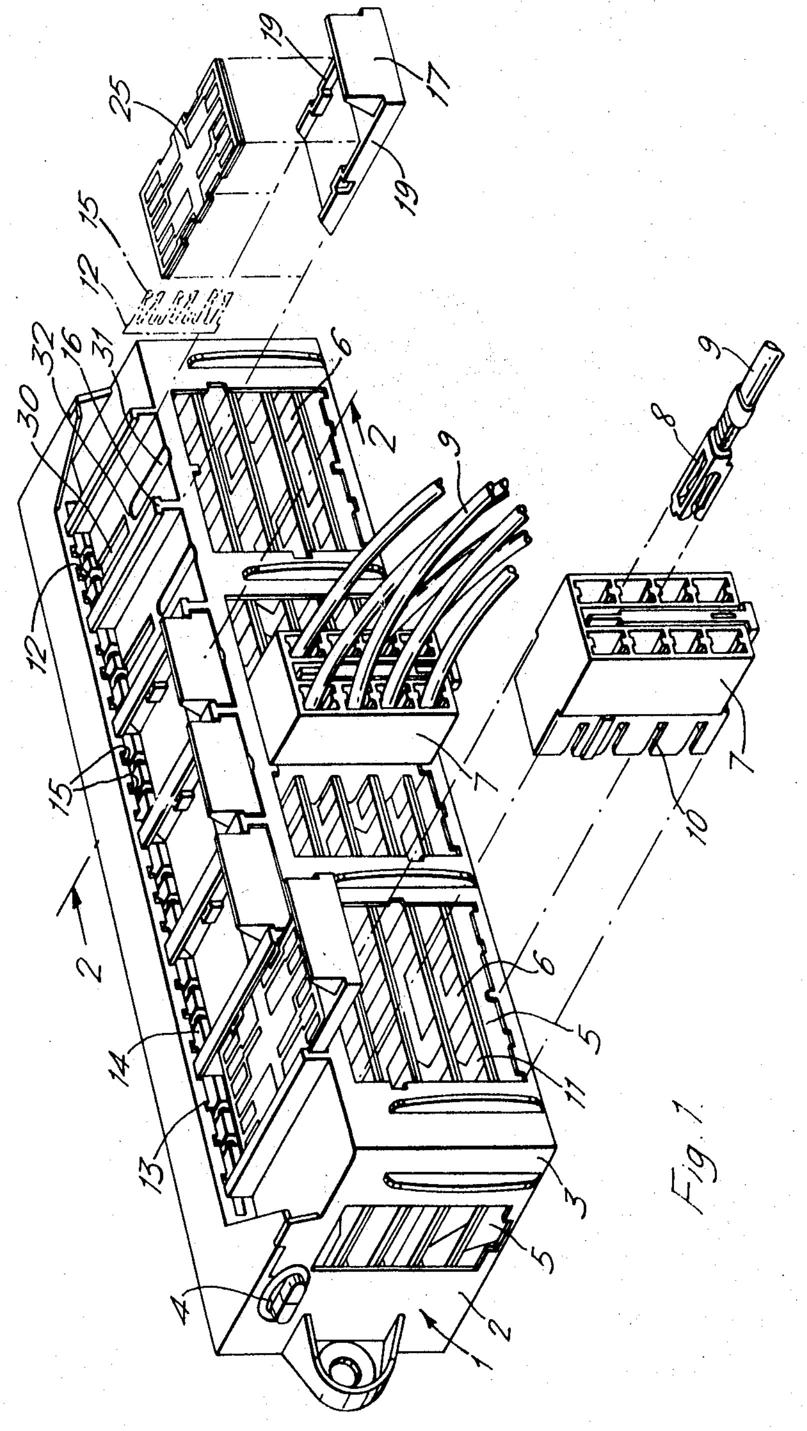
FIG. 1 is a perspective partly exploded view of a fused connector assembly.

The invention shown in FIG. 1 is generally of the kind disclosed and fully described in U.S. application Ser. No. 828,919 save for the provision of drawer-mounted printed circuit fuses in place of the cartridge fuses disclosed in the U.S. Pat. application Ser. No. 828,919. The assembly comprises a hollow box 1 having separable parts 2,3 secured together by fasteners 4. Apertures 5 formed in the front and two adjacent sides of the box expose edges of printed circuit boards 6 mounted in spaced relation in the housing. Connector blocks 7 are releasably mountable in the apertures and contain contacts 8 secured to circuit conductor wires 9. Each contact 8 is of edge connector type and the blocks 7 are slotted at 10 to correspond with the position of edges of the circuit boards 6 at the apertures 5. On insertion of a block 7 into an aperture 5, the edges of boards 6 are received in slots 10 and edge contacts 11 of the boards are engaged by appropriate contacts 8 to connect wires 9 with the circuit paths of the boards 6.

Figure 2:
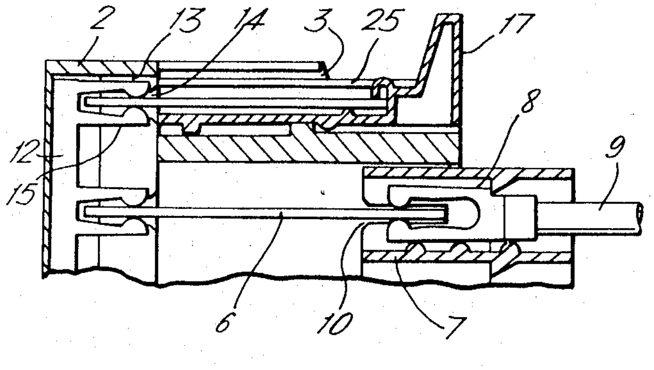
FIG. 2 is a fragmentary sectional view through a fuse unit of the assembly of FIG. 1 and on the line 2—2 of that Figure.

The circuit paths of the boards 6 are interconnected in selected manner by transversely extending conductors comprising strips 12 of fork contacts mounted in slots at the rear wall of the box 1. As seen in FIGS. 1 and 2, the upper ends of strips 12 terminate within slots 13 exposed above the forward housing part 3 and communicating with a transverse slot 14. Uppermost fork contacts 15 of each strip 12 are disposed in the slots 13 at their junctions with the transverse slot 14.

The housing part 3 is formed on its upper side with a plurality of spaced ribs 16 extending normally from the slot 14 to the front of the box 1. Each rib 16 is formed with a flanged head so that adjacent ribs define a guide for a slide-out drawer 17. The ribs 16 are so positioned that in the portion of the slot 14 exposed between adjacent ribs is disposed a group of three slots 13 and contacts 15.

Figure 3:
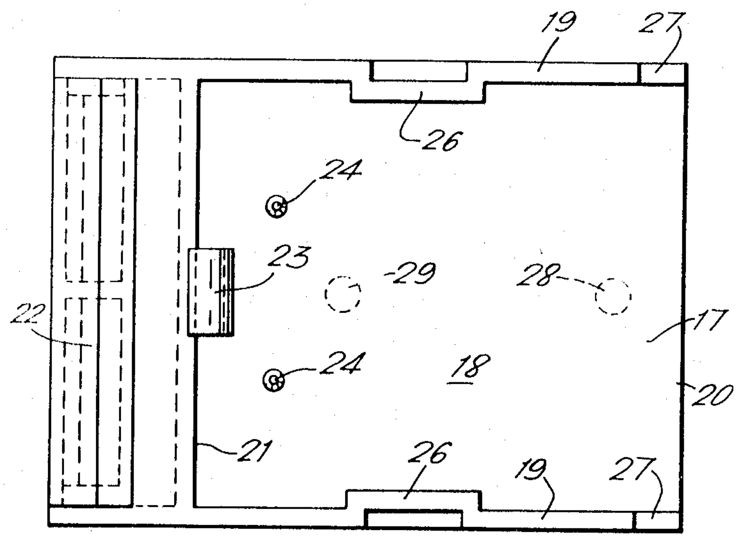
FIG. 3 is a plan view of a fuse drawer of the assembly of FIGS. 1 and 2 to an enlarged scale.
Figures 4, 5:
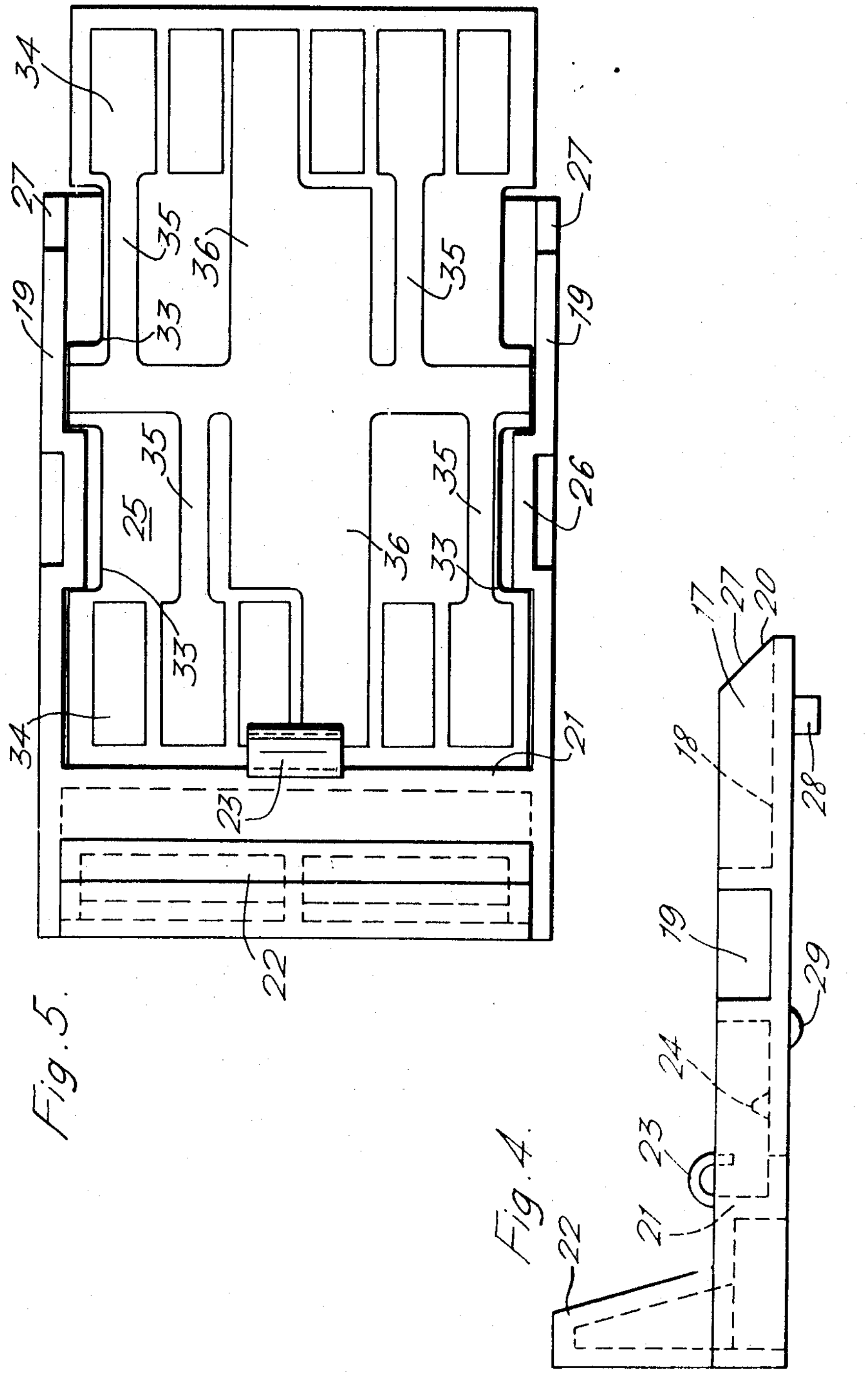
FIG. 4 is a side elevation of the drawer of FIG. 3.
FIG. 5 is a plan view of a printed circuit fuse mounted in the drawer of FIGS. 3 and 4.

Each drawer 17, as seen in FIGS. 3 and 4, has a rectangular floor 18, a pair of upright sides 19, an open front end 20, and a closed rear end 21 from which a pullout handle 22 extends upwardly. The drawer is suitably moulded from resilient plastics insulating material, and an integral resilient hook 23 is formed centrally of the rear wall 21 and projects forwardly into the rear of the drawer. Forwardly of the rear wall and the hook 23, but in a rear region of the drawer, the base 18 is formed with a pair of spaced upward projections 24, the hook 23 and projections 24 being arranged releasably to grip the rear end of a printed circuit fuse element 25 as explained below. Forwardly of projections 24 and substantially centrally of the drawer 17, each sidewall 19 is formed with an inward shoulder 26 of rectangular form, as seen in plan view, and extending throughout the wall height. The leading ends of the sidewalls 19 at the open end 20 are downwardly chamfered at 27. The floor 18 is formed on its underside with forward and rearward projections 28, 29, centrally disposed in the width of the drawer and circular as seen in plan view. The forward projection 28 extends below the rear projection 29 and has a flat lower end, whereas the projection 29 is convex dome form.

The upper side of the box part 3 between each pair of adjacent ribs 16 is formed centrally between the adjacent ribs 16 with a pair of grooves 30, 31 longitudinally aligned and parallel to the ribs 16. The inner groove 30 is of flat sided channel form and extends rearwardly from slot 14 to a shoulder 32 separating grooves 30 and 31. Groove 31 is of concave arcuate form, and the grooves 30 and 31 are arranged to receive the projections 29,28 of a drawer 17 which slides over the upper side of box part 3 with sides 19 guided by the ribs 16 and retained below the flanged heads of the ribs 16. Resilient flexure of the drawer allows insertion of the drawer into such position but resilience of the drawer at 17 is such as to resist inadvertent withdrawal. With the drawer in position between adjacent ribs 16, the projection 28 limits withdrawal movement by engaging shoulder 32 and forward movement is limited by portions of box part 2 between slots 13.

Each printed circuit fuse 25, as shown in FIG. 5, comprises a rectangular form, of width such as to be a close fit between the sides 19 of the drawer 17 but of length greater than that of the drawer between the open front end 20 and the rear wall 21. Thus, when the fuse 25 is positioned in the drawer with its rear end against the wall 21, the forward edge of the fuse projects beyond the open end 20 of the drawer. Each of the opposite side edges of the fuse is provided with a pair of spaced rectangular recesses 33 of size such as to allow each recess to engage a drawer sidewall shoulder 26. The recesses 33 are so positioned that either end of the fuse can be positioned adjacent the drawer rear wall 21 with the sidewall shoulders 26 engaged in recesses 33. The fuse is positioned with its rear end beneath the resilient hook 23 and its underside engaging the projections 24 so that the fuse may be removed by depressing its rear end to pivot the fuse about the projections 24 and lift the front end for access of fingers for manual withdrawal of the fuse.

The fuse 25 is formed on its upper and lower sides with identical circuit paths arranged so that on inverting the board in the drawer an identical circuit path is presented. The circuit path is such as to present the same pattern whichever end of the fuse is rearmost in the drawer. The fuse at both end edges is formed with six spaced contacts 34, alternate contacts being connected to circuit paths 35 and intermediate contacts not being so connected. The outer pair of contacts 34 connected to circuit paths are connected to fusible circuit paths 35 of reduced width, whereas the middle contact connected to a circuit path is connected to a circuit path 36 of increased width leading to the fusible circuit path 35. The circuit path 36 of increased width comprises a cruciform pattern having a wider limb extending between contacts 34 at opposite ends of the fuse and a narrower limb extending centrally between opposite side edges of the fuse 25. The fuse elements extend normally from the narrower limb of the cruciform circuit path 36.

It will be appreciated that contacts 34 on one face of the fuse and not connected to a circuit path fusible path 35 will be opposed on the other face of the board by contacts 34 which are connected to a fusible path 35 so that when engaged by the fork contact 15, as seen in FIG. 2, both arms of the contact 15 will engage a contact 34 of the fuse to avoid excessive insertion and withdrawal forces and abrasion if the contact 34 was omitted from one side.

As seen in FIG. 5, the leading end of the fuse projects beyond the leading end of the drawer 17 by the length of the contacts 34. In operation, when the drawer 17 is pushed to its innermost position between adjacent ribs 16, the leading end of the fuse 25 penetrates slot 14 with the upper contacts 34 connected with fusible parts 35 registering with slots 13 and being engaged by fork contacts 15 to connect the fusible circuit paths 35 in selected circuits of the circuit boards 6 and the conductor wires 9. The fuse may be disconnected by withdrawing the drawer 17 until the projection 28 engages shoulder 32. At this condition, the leading edge of the fuse 25 is clear of the slot 14 and the fuse 25 may be removed from the drawer by depressing the rear end, as has been described.

Since the fuse may be inserted in any of four ways it may be used for four events causing fuse failure before it needs to be replaced.

I claim:

1. A fuse unit comprising a generally rectangular drawer slidable in a frame, the drawer being open at one end and an upper side and being arranged releasably to receive a flat rectangular printed circuit fuse through the open upper side for support on the floor of the drawer with an edge of the printed circuit fuse projecting through the open end, the edge of the printed circuit fuse having a plurality of spaced contacts, a plurality of spaced contacts being mounted in the frame and the drawer being slidable in the frame between a withdrawn position in which the projecting edge of the printed circuit fuse is withdrawn from the contacts and the drawer is open for removal of the fuse, and a forward position in which the projecting edge of the circuit board is engaged with the contacts and the drawer is closed.

2. A fuse unit as set forth in claim 1 wherein the printed circuit fuse comprises a rectangular board having similar circuit paths on opposite sides, and on each side the circuit path presenting at forward and rear edges a plurality of spaced contacts, the contacts of each plurality being interconnected through a respective fusible circuit path or paths, and the contacts at the forward and rear edges and the circuit paths on opposite sides being so arranged that any of the four pluralities of spaced contacts can be separately engaged with the plurality of contacts in the frame of the fuse unit.

3. A fuse unit as claimed in claim 1, in which the drawer and the fuse have complementary locating means arranged so that the fuse can be located in the drawer with either end edge at the front of the drawer and either side uppermost, and so that in each condition of location an end edge of the fuse is so located at the front of the drawer that sliding the drawer in the frame towards the frame contacts, engages the frame contacts with the contacts on the upper side of the fuse.

4. A fuse unit as claimed in claim 1 in which the frame forms part of a housing containing a plurality of spaced printed circuit boards, selected circuits of different boards being interconnected by conductors extending transversely of the boards, each transverse conductor being formed at an end with a fork contact, a plurality of fork contacts being disposed in the frame in the path of the drawer to engage with contacts of the associated fuse.

5. A fuse unit as claimed in claim 1 in which the drawer has guide means engaging complementary means of the frame to limit withdrawal of the drawer to a position at which the fuse is disengaged from the frame contacts and may be manually withdrawn from the drawer.

6. A fuse unit as claimed in claim 5, in which the drawer has adjacent its rear end a basal projection arranged to support a rear of the fuse away from the floor of the drawer, and a resilient hook member arranged rearwardly of the basal projection to engage an upper side of the fuse and limit movement away from the basal projection.

* * * * *